US00RE43652E

(19) United States
(12) Reissued Patent
Saito et al.

(10) Patent Number: US RE43,652 E
(45) Date of Reissued Patent: Sep. 11, 2012

(54) SUBSTRATE PROCESSING CONTROL METHOD AND STORAGE MEDIUM

(75) Inventors: Susumu Saito, Nirasaki (JP); Akitaka Shimizu, Nirasaki (JP)

(73) Assignee: Tokyo Electron Limited, Tokyo (JP)

(21) Appl. No.: 13/278,227

(22) Filed: Oct. 21, 2011

Related U.S. Patent Documents

Reissue of:
(64) Patent No.: 7,824,931
Issued: Nov. 2, 2010
Appl. No.: 12/511,749
Filed: Jul. 29, 2009

U.S. Applications:
(60) Provisional application No. 61/095,652, filed on Sep. 10, 2008.

(30) Foreign Application Priority Data

Jul. 30, 2008 (JP) ..... 2008-196271

(51) Int. Cl.
*H01L 21/66* (2006.01)

(52) U.S. Cl. ..... 438/14; 438/5; 438/9; 438/128; 257/E21.525; 257/E21.529; 257/E21.53

(58) Field of Classification Search ..... 438/23, 438/746; 257/E21.613, E21.667
See application file for complete search history.

(56) References Cited

U.S. PATENT DOCUMENTS

2007/0221258 A1 9/2007 Saito et al.
2008/0070327 A1 3/2008 Ogasawara et al.
2008/0078948 A1 4/2008 Saito

FOREIGN PATENT DOCUMENTS

JP 2006-86168 3/2006

*Primary Examiner* — Cheung Lee
(74) *Attorney, Agent, or Firm* — Oblon, Spivak, McClelland, Maier & Neustadt, L.L.P.

(57) ABSTRACT

In a substrate processing control method, a first process acquires a first-reflectance-spectrum of a beam reflected from the first-fine-structure and a second-reflectance-spectrum of a beam reflected from the second-fine-structure for each of varying-pattern-dimensions of the first-fine-structure when the pattern-dimension of the first-fine-structure is varied. A second process acquires reference-spectrum-data for each of the varying-pattern-dimensions of the first-fine-structure by overlapping the first-reflectance-spectrum with the second-reflectance-spectrum. A third process actually measures beams reflected from the first and the second-fine-structure, respectively, after irradiating light beam on to the substrate and acquiring reflectance-spectrums of the actual-measured beams as actual-measured spectrum data. A fourth process compares the actual-measured spectrum data with the respective reference-spectrum data and acquiring, as the measured pattern-dimension, one of the varying-pattern-dimensions corresponding to reference-spectrum data that is closely matches with the actual-measured spectrum data. A final process ends the processing of the substrate if the measured pattern-dimension reaches a value.

8 Claims, 9 Drawing Sheets

SUBSTRATE PROCESSING CONTROL METHOD AND STORAGE MEDIUM

Matter enclosed in heavy brackets [ ] appears in the original patent but forms no part of this reissue specification; matter printed in italics indicates the additions made by reissue.

CROSS-REFERENCE TO RELATED APPLICATIONS

This application claims priority to Japanese Patent Application No. 2008-196271 filed on Jul. 30, 2008, the entire contents of which are hereby incorporated by reference. *This application claims the benefit under 35 U.S.C. §119(e) to U.S. Provisional Patent Application No. 61/095,652, filed Sep. 10, 2008.*

FIELD OF THE INVENTION

The present invention relates to a substrate processing control method and a storage medium thereof; and more particularly, to a substrate processing control method of controlling a processing of a substrate in which a fine line-and-space structure is formed.

BACKGROUND OF THE INVENTION

Typically, a line-and-space structure is formed by etching when semiconductor devices are manufactured from a wafer serving as a substrate.

FIGS. 7A to 7D are examples showing processes of forming the line-and-space structure by the etching. Specifically, FIGS. 7A and 7B show the process of forming the line-and-space structure of a bottom anti-reflective coating (BARC), and FIGS. 7C and 7D show the process of forming the line-and-space structure of a photoresist film.

As shown in FIGS. 7A and 7B, a wafer includes a base film 72, a BARC film 73, and a photoresist film 74, which are successively stacked on a silicon base layer 71. The photoresist film 74 has a pattern structure that partially exposes the BARC film 73 and the exposed BARC film 73 is etched by using the photoresist film 74 as a mask. During the etching, the BARC film 73 is etched in the width direction (left/right direction in FIGS. 7A and 7B) as well as in the thickness direction (up/down direction in FIGS. 7A and 7B). As a result, a plurality of narrow lines 75 is formed from remnants of the BARC film 73 on the base film 72.

As shown in FIGS. 7C and 7D, a wafer includes a base film 77, an organic film 78, a silicon-containing anti-reflective coating (SiARC) film 79, and a photoresist film 80, which are stacked in that order on a silicon base layer 76. The photoresist film 80 has a predetermined pattern structure and only the photoresist film 80 is etched. During the etching, the photoresist film 80 is also etched both in the width and the thickness direction. As a result, a plurality of narrow lines 81 is formed from remnants of the photoresist film 80 on the SiARC film 79.

Recently, the semiconductor devices have become scaled down, which requires finer processing dimension and higher processing accuracy. For example, in the line-and-space structure formed by etching, a line width (a critical dimension (CD) value, and hereinafter referred to as a "CD value") deviated from a desired value by only several nanometers, may result in non-acceptable semiconductor device performance. Accordingly, it is required to precisely control the CD value of the lines 75 or 81 in the etching.

However, the etching in FIGS. 7A and 7B is ended at the time when the BARC film 73 is partially etched and the base film 72 is exposed. The etching in FIGS. 7C and 7D is terminated if a preset etching period of time has lapsed. That is, the etchings are ended without measuring dimensions related to lines or the like. This makes it very difficult to control the accurate CD value of the lines 75 or 81.

Accordingly, there have been suggested methods of measuring the dimensions or the like related to lines by using reflected light of a white light beam and controlling the etching according to the measured result. For example, a feedback method and a feedforward method have been used. According to the feedback method, in a test wafer, a line-and-space structure for performing the measurement thereon is formed at a position, on which it is easy to perform the measurement, by the etching under a predetermined processing condition. Then, the CD value of the formed line-and-space structure is measured and the processing condition of the etching is adjusted according to the measured CD value. In the feedforward method, the dimensions or the like of pattern structure of a photoresist film of a wafer is measured before etching and the processing condition of the etching is changed according to the measured dimensions or the like.

Since, however, neither the feedback method nor the feedforward method directly measures the dimensions of the formed lines, there still remain problems in quality guarantee. Moreover, since both of the methods perform the measurement by using dedicated measuring devices, the throughput is lowered.

Further, there has been known a method, which monitors or measures the film thickness of a mask layer during the etching and ends the etching when the monitored film thickness becomes a preset thickness. (see, e.g., Japanese Patent Laid-open Application No. 2006-86168 and corresponding U.S. Pat. No. 7,514,277). In this method, the interference between reflection beams reflected from a surface of a mask layer and an interface of the mask layer and a silicon layer, which varies according to the film thickness of the mask layer, is utilized. Specifically, light is irradiated on a wafer and reflection beams reflected from the wafer are detected to evaluate the spectral reflectance (reflectance spectrum) of a plurality of wavelengths, and then measure the film thickness of the mask layer according to a preset calibration curve (reflectance spectrum).

To meet the requirement for the finer processing dimension, a plurality of lines having a same CD value is arranged with identical intervals therebetween in the fine line-and-space structure. Since, however, a space width and the CD value of each line are about tens of nanometers, the fine line-and-space structure forms a diffraction grating. In the diffraction grating, if a grating width corresponding to the CD value of lines is changed, a reflected beam brings about a phase shift and becomes a diffraction wave. Likewise, in reflection beams reflected from the fine line-and-space structure, the phase shift is caused and the reflectance spectrum is changed according to the variation of CD value. Accordingly, it may be possible to control the etching by directly measuring the dimensions of lines to thereby precisely control the CD value of lines in the etching by employing the scheme of the Japanese application supra.

To prevent the throughput from being lowered, however, it is necessary to provide an etching device with a monitoring device for measuring reflection beams in order to allow the measurement of the reflection beams to be performed for the etching device. Since the etching device has complex configuration, the monitoring device has limited mounting position. Accordingly, it may be difficult to install the monitoring device at a proper position where the measurements of the reflection beams from the fine line-and-space structure in a wafer can be optionally performed.

A semiconductor device, e.g., a chip, typically has two kinds of fine line-and-space structures as shown in FIG. 8. The sparse line-and-space structure having relatively large line pitch is a logic portion 82 and the dense line-and-space having relatively small pitch is a memory cell portion 83. Further, since the monitoring device may not be freely installed as described above, the monitoring device may not be placed close enough to the chip. Resultantly, the spot diameter of an emission beam from the monitoring device may become large, resulting in the emission beam irradiated both on to the logic portion 82 and the memory cell portion 83. Further, it may also be impossible to arrange the monitoring device to receive reflection beams reflected only from the memory cell portion 83. As a result, the monitoring device may receive the reflection beams reflected both from the logic portion 82 and the memory cell portion 83.

The method described in the aforementioned Japanese Application, is to measure the film thickness by detecting reflection beams reflected from a mask film having a single film thickness. In other words, the method does not consider a case of measuring film thickness by detecting reflection beams reflected from a mask film having various film thicknesses. As a result, if the method of the Japanese Application is applied to the chip in which reflection beams are reflected from both of the logic portion 82 and the memory cell portion 83, the spectral reflectance of a plurality of wavelengths of the received reflection beams is compared with a calibration curve prepared by considering detection of the reflection beams reflected from the single line-and-space structure. In such a case, however, accurate comparison may not be properly accomplished since the number of line-and-space structure for the detected spectral reflectance and that for the calibration curve are different. Accordingly, it is difficult to accurately control the CD value of lines in the line-and-space structures in the etching.

SUMMARY OF THE INVENTION

In view of the above, the present invention provides a substrate processing control method and a storage medium thereof, wherein the method is capable of accurately controlling pattern dimensions even when a substrate has two kinds of fine structures.

In accordance with an aspect of the present invention, there is provided a method of controlling a processing of a substrate in a substrate processing apparatus. A surface of the substrate includes a first fine structure having a pattern dimension that is smaller than a wavelength of a light beam irradiated thereon and a second fine structure having a pattern dimension that is equal to or greater than the wavelength of the irradiated light beam and the processing changes the pattern dimension of the first fine structure. The method includes: a reflectance spectrum acquiring process of acquiring in advance a first reflectance spectrum of a reflection beam reflected from the first fine structure and a second reflectance spectrum of a reflection beam reflected from the second fine structure for each of varying pattern dimensions of the first fine structure when the pattern dimension of the first fine structure is varied; a reflectance spectrum overlapping process of acquiring reference spectrum data for each of the varying pattern dimensions of the first fine structure by overlapping the first reflectance spectrum with the second reflectance spectrum; and a reflectance spectrum measurement process of actually measuring reflection beams reflected from the first and the second fine structure, respectively, after irradiating light beam on to the substrate and acquiring reflectance spectrums of the actually measured reflection beams as actually measured spectrum data. The method further includes: a pattern dimension acquiring process of comparing the actually measured spectrum data with the respective reference spectrum data and acquiring, as the measured pattern dimension, one of the varying pattern dimensions corresponding to reference spectrum data that is most closely matches with the actually measured spectrum data; and a substrate processing ending process of ending the processing of the substrate if the measured pattern dimension reaches a desired value. The reflectance spectrum acquiring process acquires the first reflectance spectrum of the reflection beam reflected from the first fine structure by using a rigorous coupled wave analysis and the second reflectance spectrum of the reflection beam reflected from the second fine structure by using a scalar analysis In accordance with another aspect of the present invention, there is provided a computer-readable storage medium storing a computer-readable program for executing a method of controlling a processing of a substrate in a substrate processing apparatus. A surface of the substrate includes a first fine structure having a pattern dimension that is smaller than a wavelength of a light beam irradiated thereon and a second fine structure having a pattern dimension that is equal to or greater than the wavelength of the irradiated light beam and the processing changes the pattern dimension of the first fine structure. The method includes a reflectance spectrum acquiring process of acquiring in advance a first reflectance spectrum of a reflection beam reflected from the first fine structure and a second reflectance spectrum of a reflection beam reflected from the second fine structure for each of varying pattern dimensions of the first fine structure when the pattern dimension of the first fine structure is varied; a reflectance spectrum overlapping process of acquiring reference spectrum data for each of the varying pattern dimensions of the first fine structure by overlapping the first reflectance spectrum with the second reflectance spectrum; and a reflectance spectrum measurement process of actually measuring reflection beams reflected from the first and the second fine structure, respectively, after irradiating light beam on to the substrate and acquiring reflectance spectrums of the actually measured reflection beams as actually measured spectrum data. The method further includes: a pattern dimension acquiring process of comparing the actually measured spectrum data with the respective reference spectrum data and acquiring, as the measured pattern dimension, one of the varying pattern dimensions corresponding to reference spectrum data that is most closely matches with the actually measured spectrum data; and a substrate processing ending process of ending the processing of the substrate if the measured pattern dimension reaches a desired value. The reflectance spectrum acquiring process acquires the first reflectance spectrum of the reflection beam reflected from the first fine structure by using a rigorous coupled wave analysis and the second reflectance spectrum of the reflection beam reflected from the second fine structure by using a scalar analysis.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

An embodiment of the present invention will now be described with reference to the accompanying drawings which form a part hereof.

Figure 8:
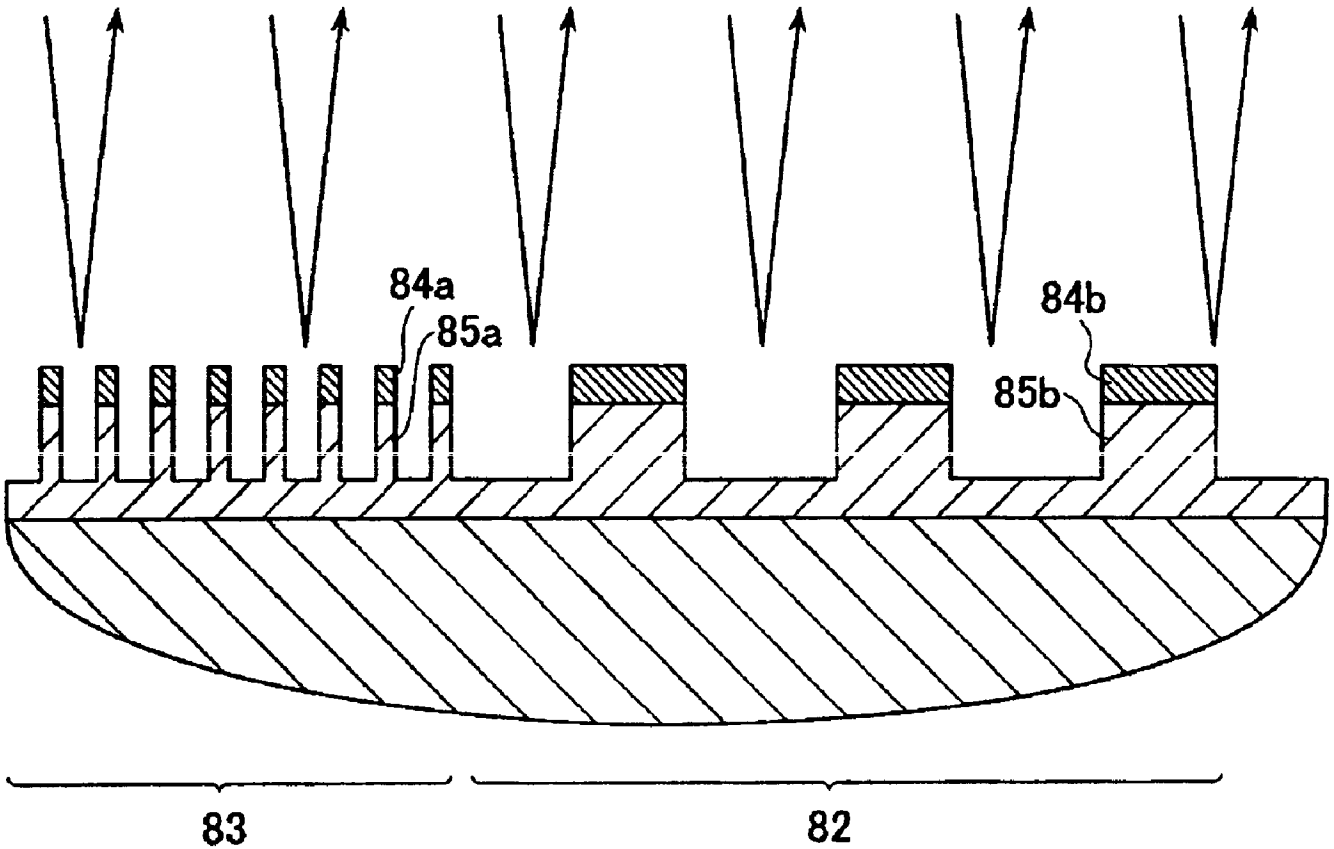
FIG. 8 is a schematic crosssectional view showing the structure of a logic portion and a memory cell portion in a semiconductor device, e.g., a chip.

First, a substrate processing apparatus 10 to which a substrate processing control method in accordance with an embodiment of the present invention is applied will be described. The substrate processing apparatus 10 is configured to perform the etching of a substrate, e.g., a semiconductor wafer W by using a plasma. The substrate processing control apparatus 10 forms line-and-space structures of the logic portion 82 and the memory cell portion 83 on a surface of the wafer W as shown in FIG. 8. The logic portion 82 and the memory cell portion 83 are not overlapped with each other on the surface of the wafer W.

Figure 1:
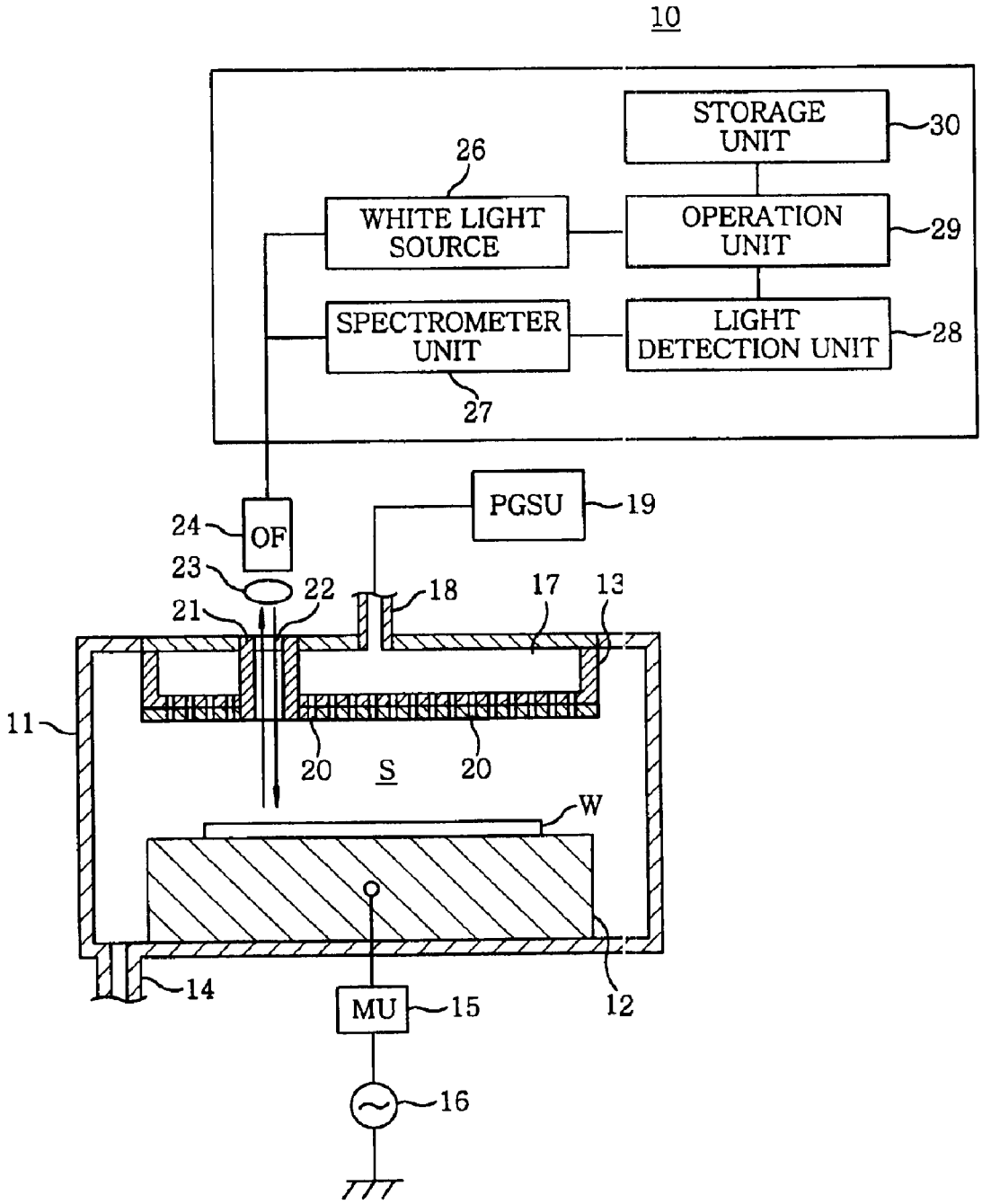
FIG. 1 is a schematic crosssectional view showing the structure of a substrate processing apparatus to which a substrate processing control method in accordance with an embodiment of the present invention is applied.

FIG. 1 is a schematic crosssectional view showing the structure of the substrate processing apparatus 10 to which the substrate processing control method in accordance with the present embodiment is applied.

As shown in FIG. 1, the substrate processing apparatus 10 includes a processing chamber 11 made of a conductive material, e.g., aluminum or the like, a lower electrode 12 arranged at a lower part of the processing chamber 11 to serve as a mounting table for mounting the wafer W thereon, and a shower head 13 arranged above the lower electrode 12 with a preset gap therebetween.

A gas exhaust port 14 connected to a vacuum exhaust device (not shown) is connected to the bottom of the processing chamber 11. A high frequency power supply 16 is connected to the lower electrode 12 via a matching unit (MU) 15. A processing gas inlet pipe 18 is connected to a buffer chamber 17 inside the shower head 13. A processing gas supply unit 19 (PGSU) is connected to the processing gas inlet pipe 18. The shower head 13 has a plurality of gas holes 20, placed at its bottom, communicating the buffer chamber 17 with a processing space S between the shower head 13 and the lower electrode 12. The shower head 13 supplies processing gas, fed from the processing gas inlet pipe 18 into the buffer chamber 17 to the processing space S through the gas holes 20.02

The substrate processing apparatus 10 reduces the pressure inside the processing chamber 11 down to a predetermined level through the gas exhaust port 14, and then supplies the processing gas to the processing space S through the shower heads 13 in the state where a high frequency voltage is supplied from the lower electrode 12 to the processing space S, thereby generating a plasma from the processing gas in the processing space S. The generated plasma etches parts of target layers 85a and 85b that are not covered by mask films 84a and 84b of the wafer W to form the logic portion 82 and the memory cell portion 83.

A monitoring device 21 for monitoring the wafer W mounted on the lower electrode 12 from thereabove is arranged in the shower head 13 inside the processing chamber 11. The monitoring device 21 formed of a cylindrical member extends through the shower head 13. A window member 22 made of a transparent material such as quartz glass or the like is provided on top of the monitoring device 21. In addition, an optical fiber (OF) 24 is arranged above the processing chamber 11 to face the top of the monitoring device 21 through a condensing lens 23.

The optical fiber 24 is connected to a CD value measuring device 25 that measures the line width (CD value) of the memory cell portion 83. The CD value measuring device 25 includes: a white light source 26 and a spectrometer unit 27, both of which are connected to the optical fiber 24; a light detection unit 28 connected to the spectrometer unit 27; an operation unit 29 connected to the light detection unit 28; and a storage unit 30 connected to the operation unit 29. The CD value measuring device 25 operates under the control of a controller (not shown) of the substrate processing apparatus 10. The white light source 26 employs a Xenon flash lamp or a halogen lamp, for example. The controller is connected to various components of the substrate processing apparatus 10, e.g., the high frequency power supply 16 to control the operations of the respective components.

Figure 2:
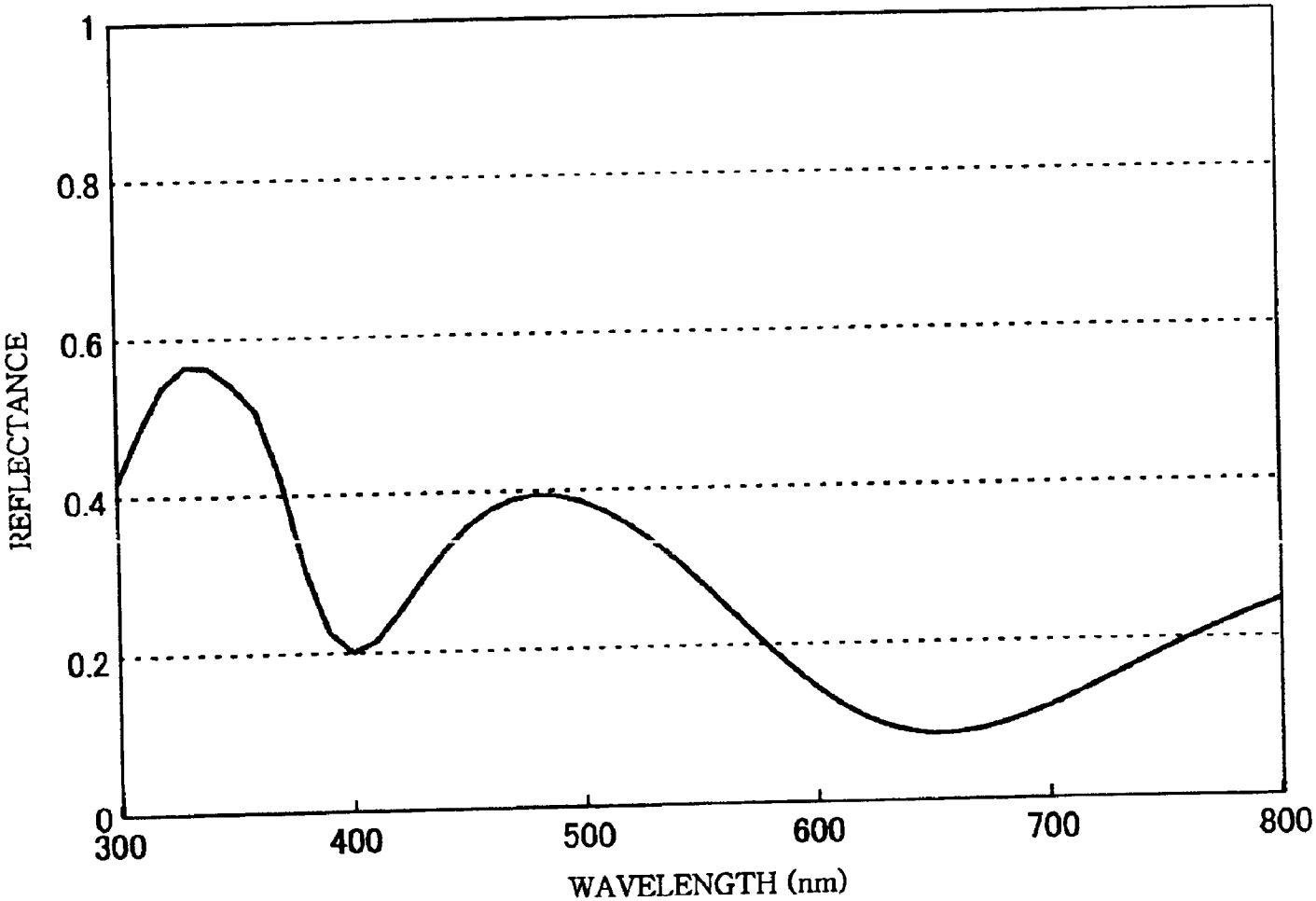
FIG. 2 is a graph showing actually measured spectrum data that is used in a substrate processing control method in accordance with the embodiment of the present invention.

The white light source 26 emits a white beam to the wafer W on the lower electrode 12 via the optical fiber 24, the condensing lens 23, and the monitoring device 21. The spectrometer unit 27 receives reflection beams reflected from the wafer W via the monitoring device 21, the condensing lens 23, and the optical fiber 24. The spectrometer unit 27 disperses the received reflection beam into its spectrum, and the light detection unit 28 detects a reflectance spectrum (reflectance for wavelength) of the reflection beam and converts the reflectance detected for each wavelength into an electric signal for the transmission thereof to the operation unit 29. The operation unit 29 acquires a reflectance spectrum based on the received electric signals as actually measured spectrum data as shown in FIG. 2 and measures the CD value of the memory cell portion 83 by comparing the actually measured spectrum data with reference spectrum data pre-stored in the storage unit 30. The reference spectra data will be described later.

In order to accurately control the CD value of the memory cell portion 83, it is necessary to measure same during the etching. Here, a space width and the CD value of line in the memory cell portion 83 are about tens of nanometers to meet the recent requirement for the fine processing dimension. Accordingly, if a white beam is irradiated, the memory cell portion 83 functions as a diffraction grating. Since the change of the grating width in the diffraction grating causes the phase shift of a reflection beam, the change in the CD value of the memory cell portion 83, which corresponds to the grating width of the diffraction grating, also causes the phase shift of a reflection beam reflected from the memory cell portion 83, thereby changing the reflectance of each wavelength of the reflection beam. As a result, if the CD value of the memory cell portion 83 is changed, the reflectance spectrum is changed.

Figure 3:
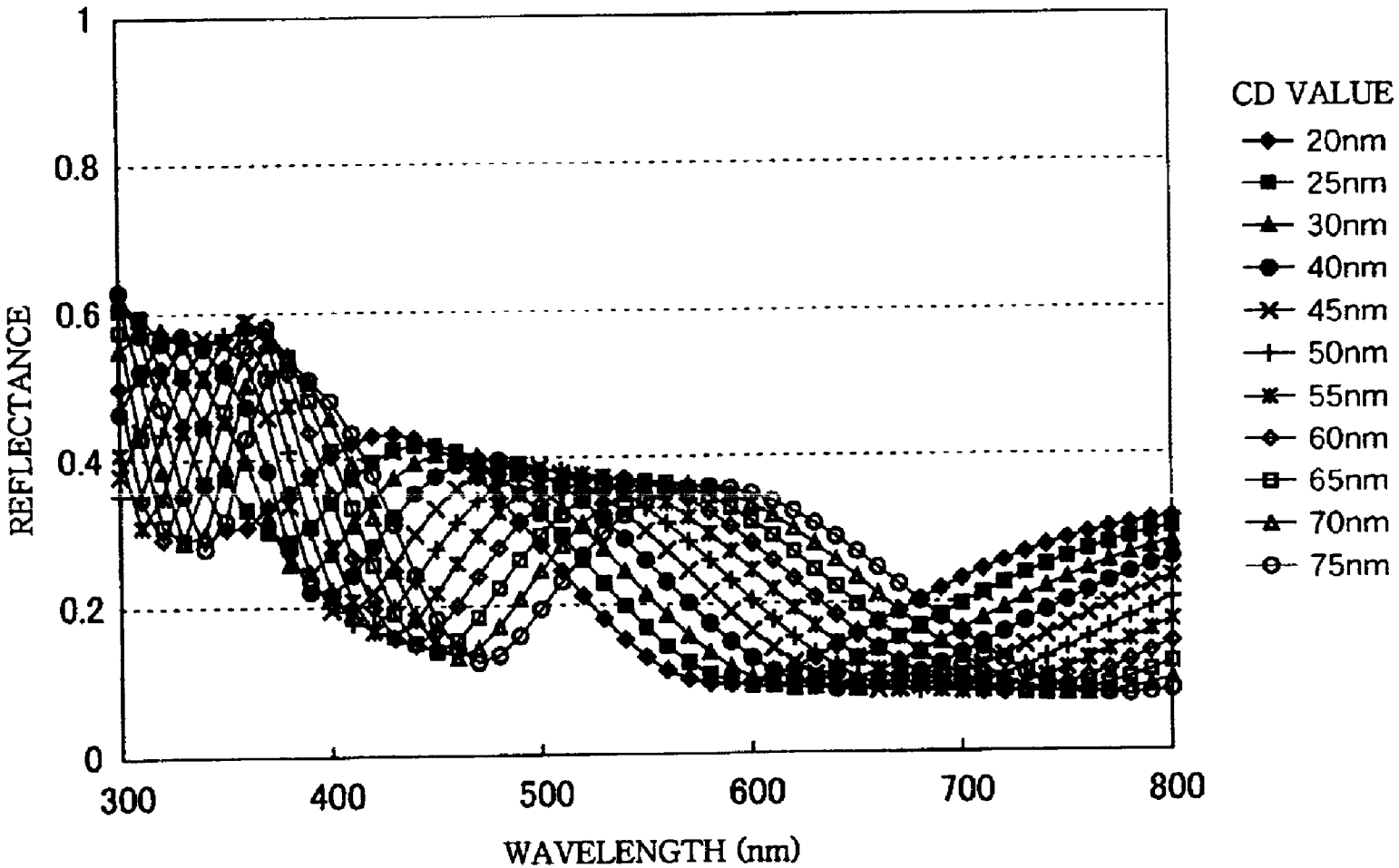
FIG. 3 is a graph showing reference spectrum data that is used in a substrate processing control method in accordance with the embodiment of the present invention.
Figure 4:
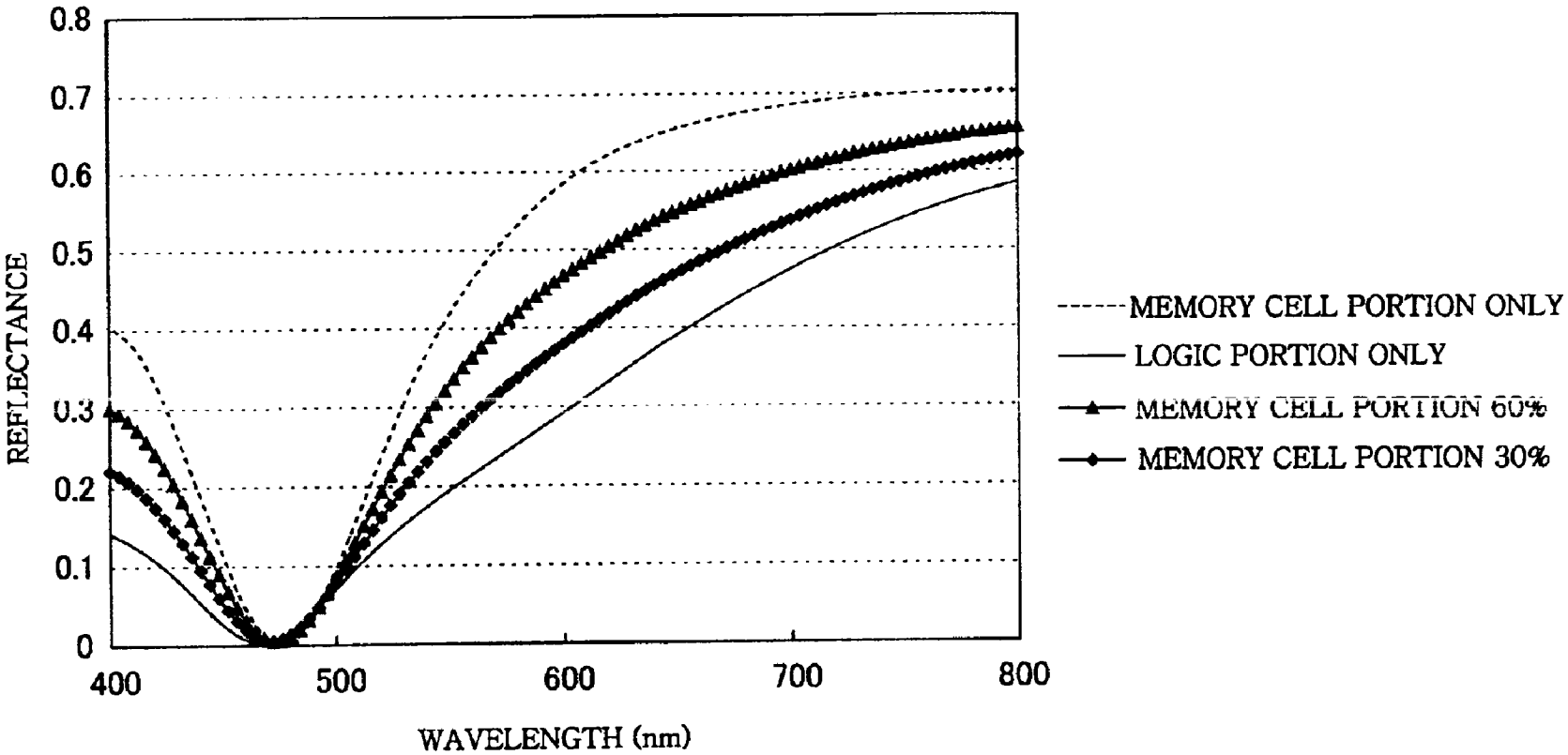
FIG. 4 a graph showing the variation of reference spectrum data according to the change in an existing ratio of a memory cell portion and a logic portion.

Accordingly, if the reflectance spectrum is acquired for CD value in advance as shown in FIG. 3 by simulation and obtained as the reference spectrum data, it is possible to acquire the CD value of the memory cell portion 83 during the etching by comparing actually measured reflectance spectrum (i.e. actually measured spectrum data) (FIG. 2) with the reference spectrum data of each CD value (each data in FIG. 3). In detail, a CD value of the reference spectrum data substantially matching with the actually measured spectrum data is obtained as the CD value of the memory cell portion 83.

However, the mounting position of the monitoring device 21 is limited in the substrate processing apparatus 10 as described above. Accordingly, the spot diameter of a white beam irradiated from the white light source 26 on a surface of the wafer W may become about 20 mm, and it may be difficult to arrange the monitoring device 21 to face the memory cell portion 83 only. As a result, the spectrometer unit 27 may receive beams in which reflection beams reflected from the memory cell portion 83 and these reflected from the logic portion 82 are overlapped with each other.

In this case, it is necessary to consider the overlapping of the reflection beams in each of the reference spectrum data. In other words, since the number of the line-and-space structures of the actually measured spectrum data is 2, it is required to determine the number of the line-and-space structures of the reference spectrum data as 2 in order to properly compare the reference spectrum data with the actually measured spectrum data.

Accordingly, when the reflectance spectrum is acquired for CD value in advance by simulation and obtained as the reference spectrum data, the present embodiment acquires the reflectance spectrum from the logic portion 82 as well as the reflectance spectrum for CD value from the memory cell portion 83 and overlaps the reflectance spectrums with each other.

The CD value of the memory cell portion 83 is about tens of nanometers, while the wavelength of the irradiated white beam is about hundreds of nanometers. As a result, the CD value of the memory cell portion 83 is smaller than the wavelength of the irradiated white beam. Accordingly, the CD value of the memory cell portion 83 is smaller than the wavelengths of most reflection beams reflected from the memory cell portion 83. On the other hand, since a line width and a space width of the logic portion 82 are about thousands of nanometers, the line width of the logic portion 82 is equal to or greater than the wavelength of the irradiated white beam. Accordingly, the line width of the logic portion 82 is greater than the wavelengths of most reflection beams reflected from the logic portion 82.

Generally, when the dimension of a target object is equal to or greater than the wavelength of a diffracted wave, the diffracted wave (frequency) analysis can use a scalar analysis executable based on the reflectance and the optical path difference only. In contrast, when the dimension of a target object is smaller than the wavelength of a diffracted wave, it may not be possible to use the scalar analysis. In this case, it may be necessary to use a rigorous coupled wave analysis (RCWA), which is an electromagnetically rigorous acquirement (see, e.g., U.S. patent application Ser. No. 09/770,997 ("Cashing of intra-layer acquirement for rapid rigorous coupled wave analysis"). The RCWA can be used when the dimension of a target object is smaller than the wavelength of a diffracted wave, but needs more acquirement time because the RCWA evaluates an eigenvalue of a vector.

Accordingly, when acquiring the reference spectrum data for CD value, the present embodiment uses the RCWA to acquire the reflectance spectrum of a reflection beam reflected from the memory cell portion 83 (referred to as "reflectance spectrum from the memory cell portion 83" (a first reflectance spectrum) hereinafter), and uses the scalar analysis to acquire the reflectance spectrum of a reflection beam reflected from the logic portion 82 (referred to as "reflectance spectrum from the logic portion 82" (a second reflectance spectrum) hereinafter).

When there are both the memory cell portion 83 and the logic portion 82 in the spot of a white beam irradiated on the surface of the wafer W, the existing ratio of the memory cell portion 83 and the logic portion 82 is changed according to the kinds of chips formed on the surface of the wafer W. If the existing ratio of the memory cell portion 83 and the logic portion 82 is changed, the ratio of an amount of a reflection beam reflected from the logic portion 82 and that of a reflection beam reflected from the memory cell portion 83 is changed in the reflection beam received by the spectrometer unit 27. That is, the actually measured spectrum data is changed according to the change in the existing ratio of the logic portion 82 and the memory cell portion 83. Accordingly, it is necessary to consider the change of the existing ratio of the logic portion 82 and the memory cell portion 83 in the reference spectrum data.

Accordingly, when acquiring the reference spectrum data in advance by simulation, the present embodiment does not perform a simple sum of the reflectance spectrums from the memory cell portion 83 and from the logic portion 82 but consider a weight factor varying according to the existing ratio of the logic portion 82 and the memory cell portion 83 in the spot. In detail, the reference spectrum data $S_R$ for each CD value of the memory cell portion 83 may be acquired by using the following Eq. 1.

$$S_R=\Sigma f\cdot I_M+(100-f)\cdot I_L \qquad \text{Eq. 1:}$$

where $I_M$ refers to the reflectance for each wavelength of the memory cell portion 83 having a specific CD value; $I_L$, the reflectance for each wavelength of the logic portion 82; f, the existing ratio (%) of the memory cell portion 83 in the spot; and 100-f, the existing ratio (%) of the logic portion 83 in the slot. If the existing ratio f is changed, e.g., from 60% to 30%, the reference spectrum data $S_R$ according to Eq. 1 is changed to approach to reference spectrum data of the case that there is only the logic portion 82 in the spot. As described above, the present embodiment also acquire, for a same CD value of the memory cell portion 83, reference spectrum data of each existing ratio by changing the existing ratio of the memory cell portion 83. As such, the reference spectrum data acquired for each CD value of the memory cell portion 83 and each existing ratio thereof is stored in the storage unit 30 before the etching.

Figure 5:
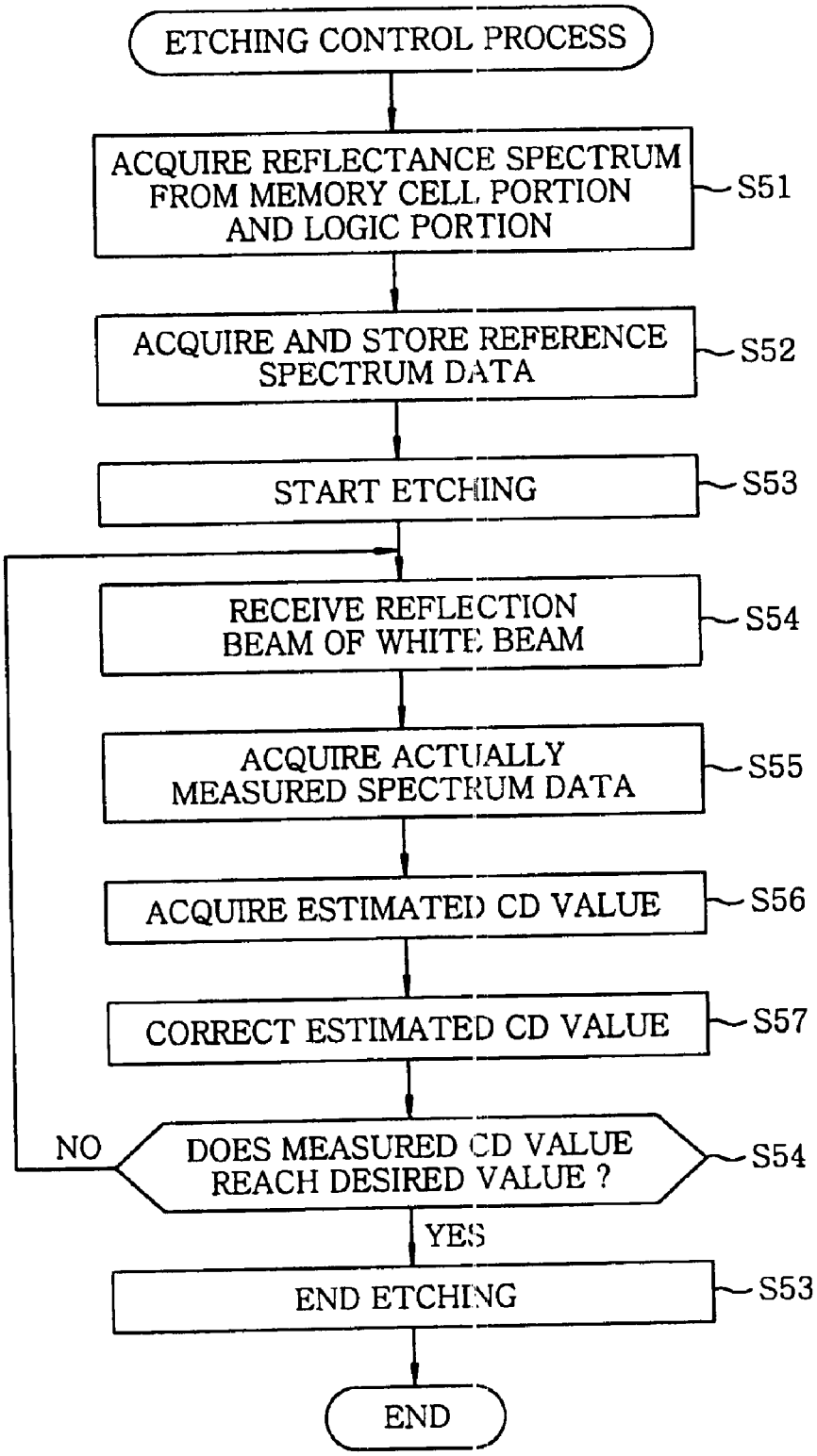
FIG. 5 is a flowchart showing a process of etching control as a substrate processing control method in accordance with the embodiment of the present invention.

FIG. 5 is a flowchart showing a process of etching control as a substrate processing control method in accordance with the embodiment of the present invention.

As shown in FIG. 5, a simulation model is first made for the case of the spot of a white beam on a surface of the wafer W having the memory cell portion 83 and the logic portion 82, which are expected to be formed by the etching. Then, as described above, the reflectance spectrum from the memory cell portion 83 is acquired by using the simulation model and applying the RCWA for each potential CD value of the memory cell portion 83 and the reflectance spectrum from the logic portion 82 is also acquired by using the simulation model and applying the scalar analysis (step S51 (reflectance spectrum acquiring step)).

Thereafter, for each possible CD value of the memory cell portion 83, the reflectance spectrum from the memory cell portion 83 and that from the logic portion 82 are summed or overlapped with each other according to the existing ratio of the logic portion 82 and the memory cell portion 83 in the spot by the Eq. 1. Accordingly, the reference spectrum data is obtained for each CD value of the memory cell portion 83 and for each existing ratio of the memory cell portion 83 (reflectance spectrum overlapping step), and the obtained reference spectrum data is storied in the storage unit 30 (step S52).

Next, the etching of the wafer W is started in the substrate processing apparatus 10 (step S53). Further, the white light source 26 emits the white beam to the wafer W, and the spectrometer unit 27 receives the reflection beam reflected from the memory cell portion 83 and the logic portion 82 in the spot of the white beam (step S54). The spectrometer unit 27 and the light detection unit 28 disperse the received reflection beam into its spectrum and obtain actually measured spectrum data, e.g., reflectance spectrum of the reflection beam (step S55 (reflectance spectrum actual measurement step)).

Then, the operation unit 29 compares the actually measured spectrum data with each of the reference spectrum data stored in the storage unit 30 and obtains the CD value of the reference spectrum data, which most closely matches with the actually measured spectrum data, as an estimated CD value (e.g., the dimension of a pattern to be measured) of the memory cell portion 83 (step S56 (pattern dimension acquiring step)).

Figure 6:
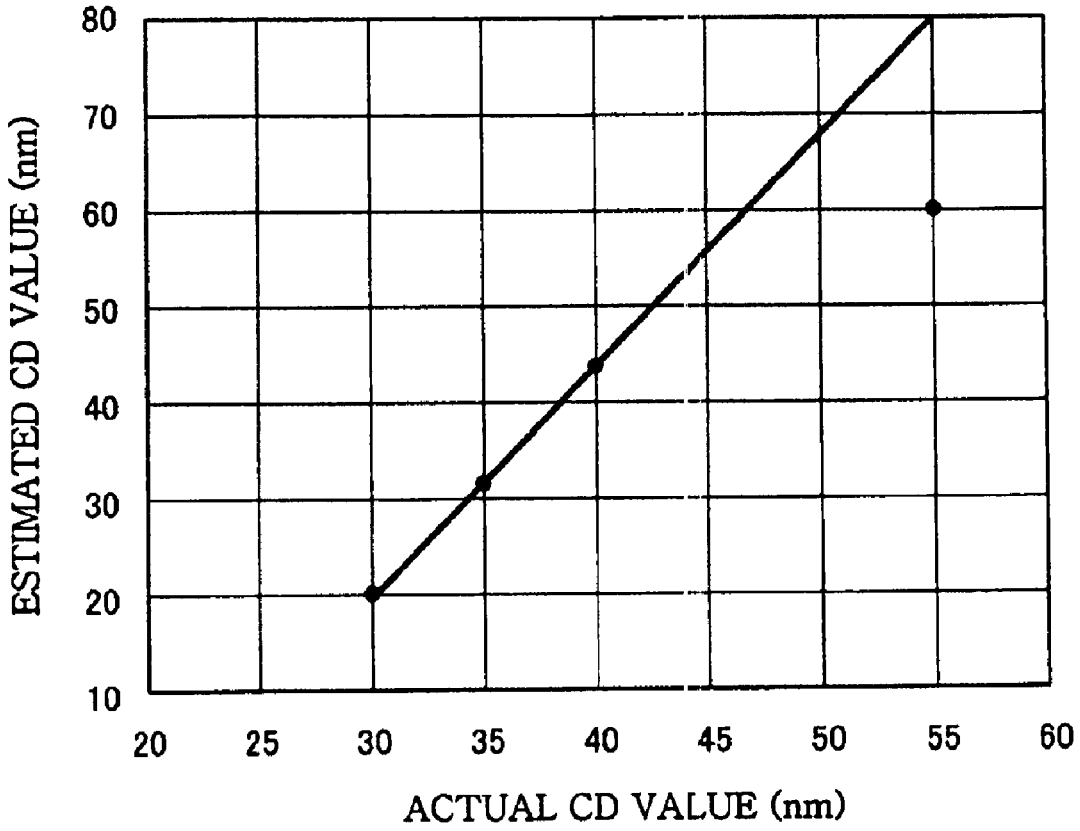
FIG. 6 is a graph showing the relationship between an estimated CD value and an actual CD value.
Figure 7A:
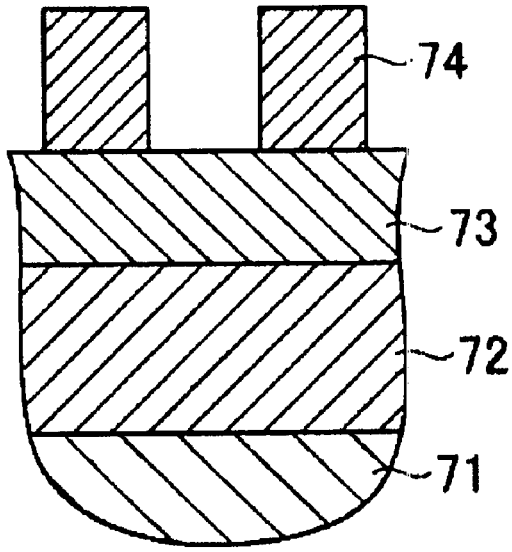
FIGS. 7A to 7D show examples of processes of forming line-and-space structures by etching, FIGS. 7A and 7B showing the process of forming the line-and-space structure in an anti-reflection film, and FIGS. 7C and 7D showing the process of forming the line-and-space structure in a photoresist film.
Figure 7B:
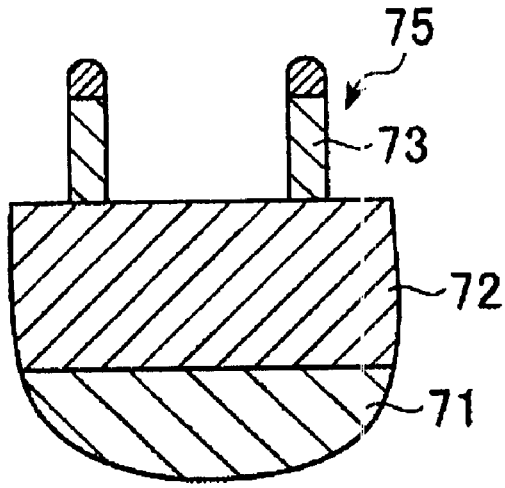
Figure 7C:
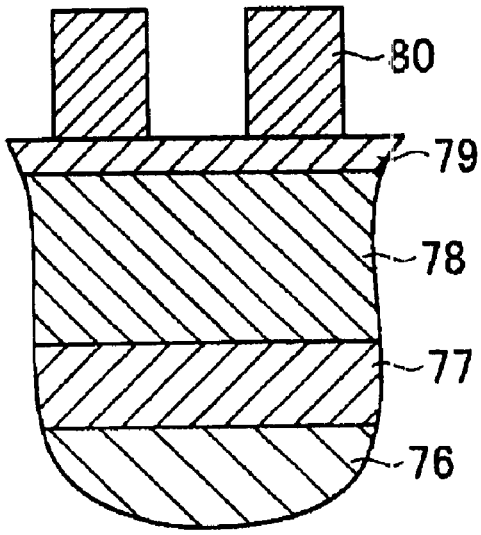
Figure 7D:
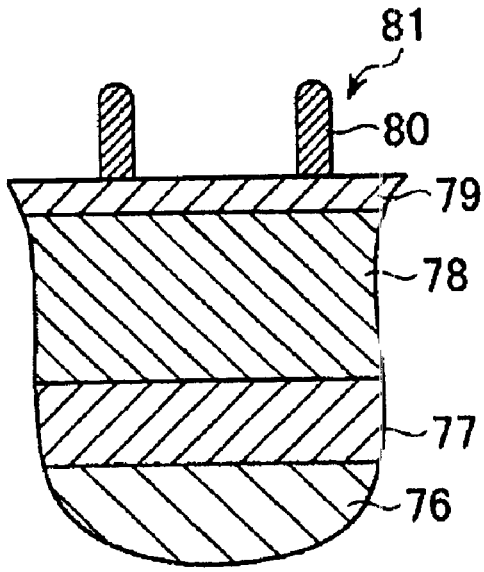

Here, since the estimated CD value is a value obtained from the reference data produced based on the simulation model, there may be an error between the estimated CD value and the actual CD value. Accordingly, in the present embodiment, the relationship between the estimated CD value and the actual CD value (FIG. 6) is obtained by using a different wafer or the like before starting the etching and the estimated CD value is corrected based on the thus obtained relationship to acquire the corrected estimated CD value as the measured CD value (step S57).

Thereafter, in step S58, the controller of the substrate processing apparatus 10 determines whether the measured CD value reaches a desired value. If the measured CD value does not reach the desired value, the process goes back to the step S54. If the measured CD value reaches a desired value, the etching of the wafer W is ended (step S59 (substrate processing ending step)). Then, the process is ended.

In accordance with the etching control process in FIG. 5, the reflectance spectrum from the memory cell portion 83 and that from the logic portion 82 are overlapped with each other both in each of the reference spectrum data and the actually measured spectrum data. Accordingly, the actually measured spectrum data and the respective reference spectrum data have the same number of line-and-space structures. This makes it possible to accurately compare the actually measured spectrum data with the respective reference spectrum data. Moreover, since the overlapping of the reflection beams can be represented as the sum of a plurality of spectrums, the accuracy of the acquired reference spectrum data can be improved. As a result, it is possible to accurately measure the CD value of the memory cell portion 83 even when the wafer W has two kinds of line-and-space structures, i.e., the memory cell portion 83 and the logic portion 82, thereby enabling to accurately control the CD value of the memory cell portion 83.

In addition, in accordance with the etching control process in FIG. 5, the reflectance spectrum from the memory cell portion 83 is acquired, by using the RCWA, from a reflection beam reflected from the memory cell portion 83 having a CD value that is smaller than the wavelength of an irradiated white beam. In contrast, the reflectance spectrum from the logic portion 82 is acquired, by using the scalar analysis, from a reflection beam reflected from the logic portion 82 having a line width that is equal or greater than the wavelength of an irradiated white beam. A reflection beam reflected from a pattern having a dimension, which is smaller than the wavelength of an irradiated white beam, may not be accurately analyzed by using the scalar analysis, but can be accurately analyzed by using the RCWA. Meanwhile, the scalar analysis is simpler than the RCWA, and thus the scalar analysis has short analysis time. Accordingly, the accuracy of the respective reference spectrum data can be greatly improved by selectively using the RCWA and the scalar analysis, and it is also possible to shorten the time required in acquiring the respective reference spectrum data.

Then, the etching control process in FIG. 5 acquires each reference spectrum data by overlapping the reflectance spectrum from the memory cell portion 83 and that from the logic portion 82 according to the existing ratio of the memory cell portion 83 and the logic portion 82 in the light spot. Accordingly, it is possible to further improve the accuracy of the respective reference spectrum data.

Moreover, since the memory cell portion 83 and the logic portion 82 are not overlapped with each other on the aforementioned wafer W, there occurs no interference between the reflection beams reflected from the memory cell portion 83 and the logic portion 82. As a result, the actually measured spectrum data is acquired as the reflectance spectrum of a beam in which the reflection beams reflected from the memory cell portion 83 and the logic portion 82 are overlapped with each other. Accordingly, the actually measured spectrum data can be accurately compared with the reference spectrum data in which the reflectance spectrum from the memory cell portion 83 is overlapped with the reflectance spectrum from the logic portion 82, thereby measuring the CD value of the memory cell portion 83 more accurately.

Although the etching control process in FIG. 5 is executed to accurately control the CD value of a line-and-space structure, a control target of the etching control process in FIG. 5 is not limited to the present embodiment. For example, it is possible to accurately control the diameter of a hole formed by the etching. In detail, when there are two kinds of holes having different diameters in the spot of a white beam, it is possible to accurately control the diameter of the hole which is smaller than the wavelength of the white beam.

Moreover, although the etching control process in FIG. 5 is executed when there are two kinds of line-and-space structures in the spot of a white beam, the etching control process can be also applied when there are three or more kinds of line-and-space structures in the spot of the white beam. In this case, the reference spectrum data is acquired by overlapping the reflectance spectrums of reflection beams respectively reflected from three or more kinds of line-and-space structures and the reference spectrum data is compared with the actually measured spectrum data.

In the present invention, the substrate etched by the substrate processing apparatus 10 is a wafer for making semiconductor devices. However, the substrate to be etched is not limited to the present embodiment. For example, the substrate may be a glass substrate for use in a liquid crystal display (LCD) or a flat panel display (FPD).

The purpose of the present invention is achieved by providing a computer (e.g. a controller) with a storage medium storing program codes of software realizing the operations of the present embodiment and allowing a central processing unit (CPU) to read and execute the program codes stored in the storage medium.

In this case, the codes themselves read from the storage medium realizes the functions of the aforementioned embodiment, and thus the present invention includes the program codes and the storage medium storing the program codes.

The storage medium for providing the program codes may be, e.g., a RAM, an NV-RAM, a floppy disk, a hard disk, a magneto-optical disk, an optical disk such as CD-ROM, CD-R, CD-RW, and DVD (DVD-ROM, DVD-RAM, DVD-RW, and DVD+RW), a magnetic tape, a nonvolatile memory card, or other types of ROM capable of storing the program codes. The program codes may be provided to the computer by being downloaded from another computer or a database, which is not shown, connected to the Internet, a commercial use network, a local area network, or the like.

The operations of the aforementioned embodiment can be realized by executing the program codes read by the computer or by the actual processing partially or wholly executed by an operating system (OS) operated on the CPU according to the instructions of the program codes.

In addition, the operations may also be realized by the actual processing partially or wholly executed by a CPU or the like in a built-in function extension board or an external function extension unit of a computer according to the instructions of program codes read from a storage medium after the program codes are inputted into a memory in the built-in function extension board or the external function extension unit.

The program codes may be object codes, program codes executed by an interpreter, script data provided to an operating system, or the like.

While the invention has been shown and described with respect to the embodiments, it will be understood by those skilled in the art that various changes and modification may be made without departing from the scope of the invention as defined in the following claims.

What is claimed is:

1. A method of controlling a processing of a substrate in a substrate processing apparatus, a surface of the substrate including a first fine structure having a pattern dimension that is smaller than a wavelength of a light beam irradiated thereon and a second fine structure having a pattern dimension that is equal to or greater than the wavelength of the irradiated light beam, the processing changing the pattern dimension of the first fine structure, the method comprising:

a reflectance spectrum acquiring process of acquiring in advance a first reflectance spectrum of a reflection beam reflected from the first fine structure and a second reflectance spectrum of a reflection beam reflected from the second fine structure for each of varying pattern dimensions of the first fine structure when the pattern dimension of the first fine structure is varied;

a reflectance spectrum overlapping process of acquiring reference spectrum data for each of the varying pattern dimensions of the first fine structure by overlapping the first reflectance spectrum with the second reflectance spectrum;

a reflectance spectrum measurement process of actually measuring reflection beams reflected from the first and the second fine structure, respectively, after irradiating light beam on to the substrate and acquiring reflectance spectrums of the actually measured reflection beams as actually measured spectrum data;

a pattern dimension acquiring process of comparing the actually measured spectrum data with the respective reference spectrum data and acquiring, as the measured pattern dimension, one of the varying pattern dimensions corresponding to reference spectrum data that is most closely matches with the actually measured spectrum data; and a substrate processing ending process of ending the processing of the substrate if the measured pattern dimension reaches a desired value, wherein the reflectance spectrum acquiring process acquires the first reflectance spectrum of the reflection beam reflected from the first fine structure by using a rigorous coupled wave analysis and the second reflectance spectrum of the reflection beam reflected from the second fine structure by using a scalar analysis.

2. The method of claim 1, wherein the reflectance spectrum overlapping process overlaps the first reflectance spectrum with the second reflectance spectrum according to an existing ratio of the first fine structure and the second fine structure.

3. The method of claim 2, wherein the first fine structure is not overlapped with the second fine structure on the surface of the substrate.

4. The method of claim 2, wherein a diameter of the light beam irradiated on the surface of the substrate is equal to or greater than 20 mm.

5. The method of claim 1, wherein the first fine structure is not overlapped with the second fine structure on the surface of the substrate.

6. The method of claim 5, wherein a diameter of the light beam irradiated on the surface of the substrate is equal to or greater than 20 mm.

7. The method of claim 1, wherein a diameter of the light beam irradiated on the surface of the substrate is equal to or greater than 20 mm.

8. A computer-readable storage medium storing a computer-readable program for executing a method of controlling a processing of a substrate in a substrate processing apparatus, a surface of the substrate including a first fine structure having a pattern dimension that is smaller than a wavelength of a light beam irradiated thereon and a second fine structure having a pattern dimension that is equal to or greater than the wavelength of the irradiated light beam, the processing changing the pattern dimension of the first fine structure, the method comprising:

a reflectance spectrum acquiring process of acquiring in advance a first reflectance spectrum of a reflection beam reflected from the first fine structure and a second reflectance spectrum of a reflection beam reflected from the second fine structure for each of varying pattern dimensions of the first fine structure when the pattern dimension of the first fine structure is varied;

a reflectance spectrum overlapping process of acquiring reference spectrum data for each of the varying pattern dimensions of the first fine structure by overlapping the first reflectance spectrum with the second reflectance spectrum;

a reflectance spectrum measurement process of actually measuring reflection beams reflected from the first and the second fine structure, respectively, after irradiating light beam on to the substrate and acquiring reflectance spectrums of the actually measured reflection beams as actually measured spectrum data;

a pattern dimension acquiring process of comparing the actually measured spectrum data with the respective reference spectrum data and acquiring, as the measured pattern dimension, one of the varying pattern dimensions corresponding to reference spectrum data that is most closely matches with the actually measured spectrum data; and a substrate processing ending process of ending the processing of the substrate if the measured pattern dimension reaches a desired value, wherein the reflectance spectrum acquiring process acquires the first reflectance spectrum of the reflection beam reflected from the first fine structure by using a rigorous coupled wave analysis and the second reflectance spectrum of the reflection beam reflected from the second fine structure by using a scalar analysis.

* * * * *